United States Patent
Chen et al.

(10) Patent No.: US 9,384,815 B2
(45) Date of Patent: Jul. 5, 2016

(54) MECHANISMS FOR PREVENTING LEAKAGE CURRENTS IN MEMORY CELLS

(71) Applicant: TAIWAN SEMICONDUCTOR MANUFACTURING CO., LTD., Hsin-Chu (TW)

(72) Inventors: Shih-Hsien Chen, Zhubei (TW); Hau-Yan Lu, Hsinchu (TW); Liang-Tai Kuo, Zhudong Township (TW); Chun-Yao Ko, Hsinchu (TW); Felix Ying-Kit Tsui, Cupertino, CA (US)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 64 days.

(21) Appl. No.: 14/048,873

(22) Filed: Oct. 8, 2013

(65) Prior Publication Data
US 2015/0098266 A1   Apr. 9, 2015

(51) Int. Cl.
| | |
|---|---|
| *G11C 16/10* | (2006.01) |
| *G11C 11/401* | (2006.01) |
| *G06F 3/06* | (2006.01) |
| *H01L 27/115* | (2006.01) |
| *G11C 16/04* | (2006.01) |
| *G11C 16/34* | (2006.01) |
| *G11C 16/12* | (2006.01) |
| *G11C 16/30* | (2006.01) |

(52) U.S. Cl.
CPC ............ *G11C 11/401* (2013.01); *G06F 3/0625* (2013.01); *G11C 16/0425* (2013.01); *G11C 16/3418* (2013.01); *H01L 27/11558* (2013.01); *G11C 16/10* (2013.01); *G11C 16/12* (2013.01); *G11C 16/30* (2013.01)

(58) Field of Classification Search
CPC .......... G11C 16/10; G11C 16/30; G11C 16/12
USPC ..................................................... 365/185.18
See application file for complete search history.

(56) References Cited

U.S. PATENT DOCUMENTS

| | | | | |
|---|---|---|---|---|
| 2005/0269619 | A1* | 12/2005 | Shor ................... | H01L 27/0811 257/313 |
| 2007/0121381 | A1* | 5/2007 | Kalnitsky ........... | G11C 16/0433 365/185.18 |

\* cited by examiner

*Primary Examiner* — Jason Lappas
(74) *Attorney, Agent, or Firm* — Birch, Stewart, Kolasch & Birch, LLP

(57) ABSTRACT

Memory cells and operation methods thereof are provided. A memory device includes a number of memory cells. Each of the memory cells includes a first transistor, a switch and a capacitor. The first transistor has a drain connected to a corresponding bit-line. The switch has a first terminal connected to a source of the first transistor and a second terminal coupled to a reference voltage. The capacitor has a first plate and a second plate, and the first plate of the capacitor is electrically connected to a gate of the first transistor. The second plate of the capacitor is connected to a corresponding word line. The switch is turned off when the memory cell is not selected to perform a write operation or a read operation.

18 Claims, 4 Drawing Sheets

MECHANISMS FOR PREVENTING LEAKAGE CURRENTS IN MEMORY CELLS

BACKGROUND

Semiconductor devices are used in a variety of electronic applications, such as personal computers, cell phones, digital cameras, and other electronic equipment. Memory devices are one type of semiconductor device. Memory devices typically include an array of memory cells, with each memory cell being adapted to store digital information or data as "1" or "0". Some memory devices are referred to as volatile memories because of their need to be refreshed to retain the data, while others are referred to as non-volatile memories (NVMs) because they do not require refreshing.

A recent development in NVMs is multiple-time programmable (MTP) NVMs, which are programmable multiple times. In comparison with high density NVM (such as flash memory or E2PROMS), MTP memories are suitable for low-density applications, and are usually characterized by a higher memory cell size and a lower number of masking operations required to manufacture the memory cells. However, there are still challenges in operating the NVMs properly.

BRIEF DESCRIPTION OF THE DRAWINGS

For a more complete understanding of the embodiments, and the advantages thereof, reference is now made to the following descriptions taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure. Some variations of the embodiments are described. Throughout the various views and illustrative embodiments, like reference numbers are used to designate like elements.

Some embodiments of the present disclosure are related to memory devices and methods of manufacturing thereof. Novel designs and structures of memory devices comprising MTP NVMs will be described herein.

Figure 1:
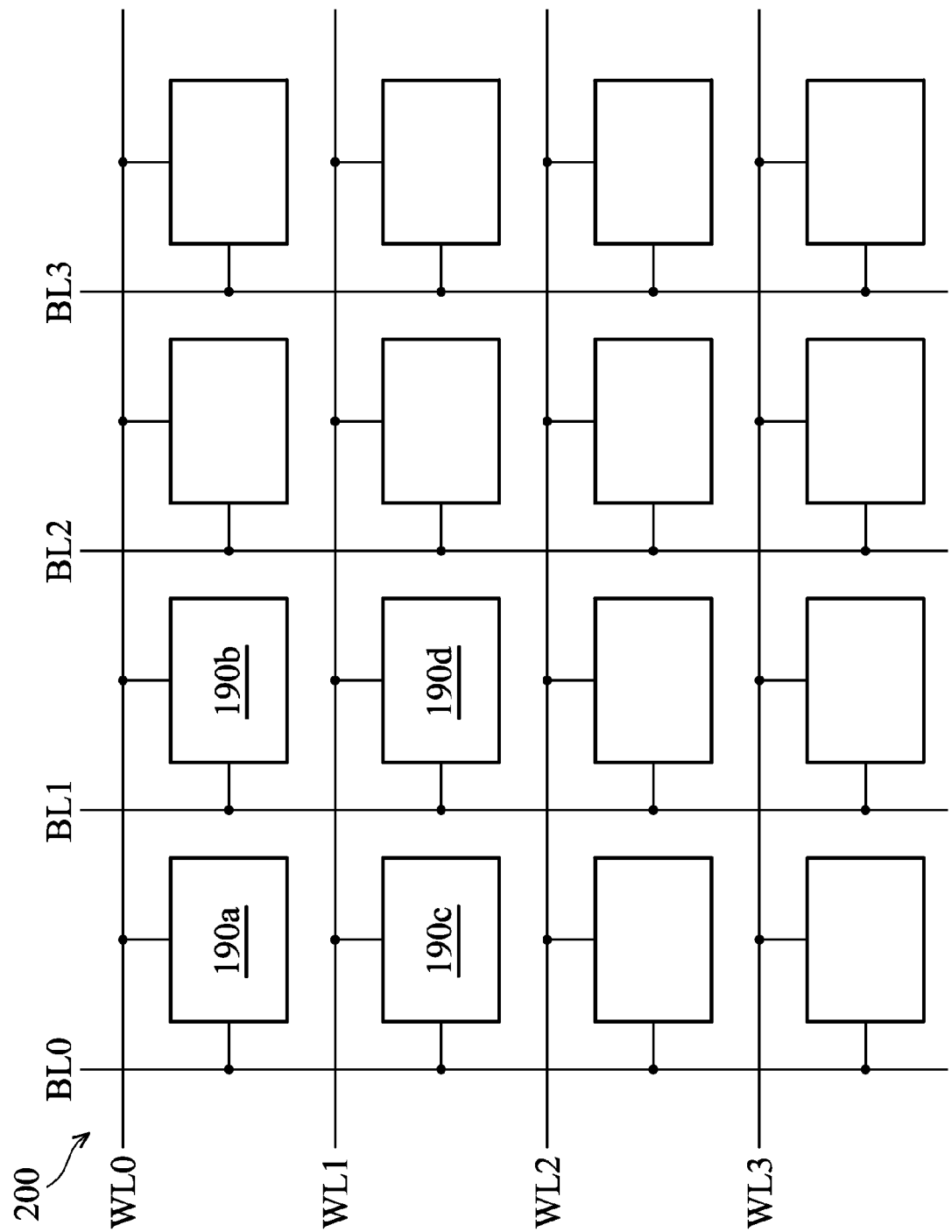
FIG. 1 illustrates a schematic of a memory device including a number of memory cells in accordance with some embodiments.

FIG. 1 illustrates a schematic of a memory device 200 including a number of memory cells 190 in accordance with some embodiments. The memory device 200 has bit lines and word lines. For example, if the bit line BL1 and the word line WL1 are applied with certain voltages, the memory cell 190d is selected to perform a write operation and/or a read operation. However, if at least one of the other unselected memory cells 190a, 190b, and 190c generate leakage current, such leakage current may affect the electrons of the electronic elements of the selected memory device 190d, so that the memory device 190d may not function properly. Therefore, a novel memory cell is needed to prevent the leakage current of the memory cells, so that the selected memory cell could function properly on erase, write and/or read operations.

In some embodiments, the memory device 200 includes at least one memory array, and the memory array includes at least one memory cell 190. In other embodiments, each of the memory cells 190 is identical to each other. The novel memory cells 190 of MTP NVM described here have useful application in storing program code and/or data on system-on-chip (SOC) applications, as a substitute for external flash memory devices, or replacements for read-only memory (ROM) devices, programmable ROM (PROM) devices, erasable PROM (EPROM) devices, electrically erasable PROM (EEPROM) devices, and other types of memory devices, for example.

Figure 2:
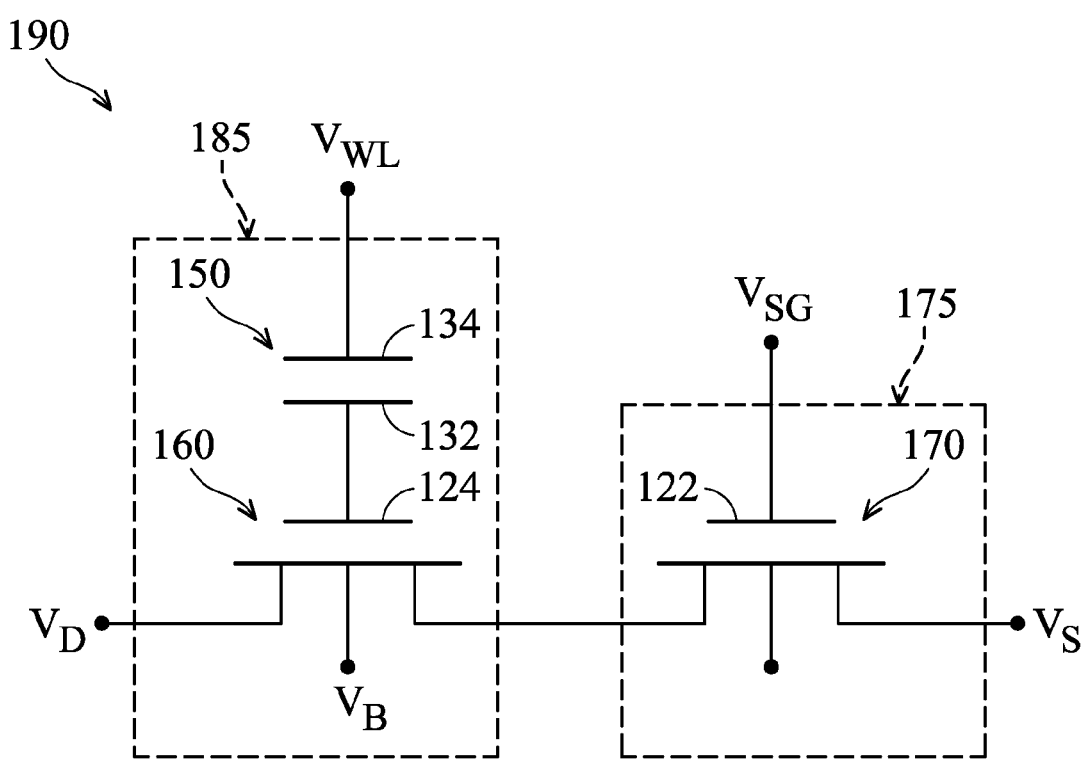
FIG. 2 illustrates a schematic of the memory cell in accordance with some embodiments.

FIG. 2 illustrates a schematic of the memory cell 190 in accordance with some embodiments. Referring to FIG. 2, the memory cell 190 includes a memory unit 185 and a switch 175. In some embodiments, the memory unit 185 includes a capacitor 150 and a first transistor 160. The switch 175 includes a second transistor 170. When the memory cell 190 is not selected to perform a read operation or a write operation, switch 175 could be turned off so that the leakage current from the memory cell 185 can not pass through. Therefore, there is almost no leakage current generated by the un-selected memory cell 190.

Specifically, the memory cell 190 includes a capacitor 150, a first transistor 160, and a second transistor 170. The capacitor 150 has a first plate 132 and a second plate 134, wherein the second plate 134 is connected to a word line and/or connected to the terminal $V_{WL}$. The capacitor 150 includes a metal-oxide-metal (MOM) capacitor, a metal-insulation-metal (MIM) capacitor, a capacitor-connected transistor, or a combination thereof. The first transistor 160 has a gate 124 electrically connected to the first plate 132 to form a floating gate. The gate 124 as well as the floating gate is adapted to store a data state indicative of a "1" or "0" in some embodiments, for example. More specifically, some electrons will be trapped on the gate 124 as the data state. The first transistor 160 has a drain connected to the terminal $V_D$, and has a source connected to the drain of the second transistor 170. Therefore, the second transistor 170 is coupled to the first transistor 160 in series. In addition, a terminal $V_B$ is coupled to the bulk or the substrate of the first transistor 160.

The second transistor 170 has a gate 122 connected to the terminal $V_{SG}$, and has a drain connected to the source of the first transistor 160, and has a source connected to the terminal $V_S$. The terminal $V_S$ is applied with a reference voltage or connected to the ground. The second transistor 170 is coupled to the first transistor 160 in series. In some embodiments, the first transistor 160 and the second transistor 170 are NMOS (N-Type Metal Oxide Semiconductor) transistors. The terminals $V_D$, $V_{WL}$, $V_{SG}$, $V_S$ and $V_B$ may comprise conductive lines, contact pads, and/or terminals in upper levels of the memory cell 190 that are coupled to the various regions of the memory cell 190 using the contacts.

In some embodiments, the second transistor 170 in the memory cell 190 is omitted. Such a memory cell 190 has a small size, but could have leakage current. Specifically, when the memory cell 190 is not selected, i.e. when the memory cell 190 is in an erase state but not selected to perform a read operation or on a write operation, some leakage currents will pass through the active region of the first transistor 160 voltage if there exists a voltage drop between thermals $V_D$ and $V_S$. Therefore, it is desirable to find alternative mechanisms for the memory cell 190 to prevent leakage current. In other embodiments, the memory cell 190 further includes a second transistor 170 connected to the first transistor 160 in series. If the memory cell 190 is not selected, then the second transistor 170 is turned off. Afterwards, even if some voltage drops between thermals $V_D$ and $V_S$ exist, since the second transistor 170 is turned off, there is no leakage current pass through the second transistor 170. Therefore, there is no leakage current from the memory cell 190 when it is not selected to perform a read operation or a write operation.

The operation of the memory cell 190, which includes erase, program and read the memory cell 190 will be described next. Referring again to FIG. 2, the first transistor 160 and the second transistor 170 are turned on when the memory cell 190 is selected to perform a program operation which belongs to the write state. The gate 124 of the first transistor 160 is adapted to store a bit of information, and the bit of information is erasable with a first erase state and a second erase state both belonging to the write state. In some embodiments, when the memory cell 190 is in the first erase state, the first transistor 160 is weakly turned on and the second transistor 170 is turned on, for example. When the memory cell 190 is in the second erase state, the first transistor 160 is weakly turned-on and the second transistor 170 is turned off. In addition, the first transistor 160 and the second transistor 170 are turned on when the memory cell 190 is on the read operation, for example. In other embodiments, the second transistor 170 is turned off when the memory cell 190 is not selected to perform a write operation or a read operation.

In a program operation, a voltage of the terminal $V_D$ is higher than a voltage of terminal $V_S$, a voltage of terminal $V_{WL}$ is higher than a voltage of terminal $V_S$, a voltage of terminal $V_{SG}$ is higher than a voltage of terminal $V_B$, and voltages of terminals $V_S$ and $V_S$ are approximately equal to 0. Specifically, voltages of about 6 to 8 volts are applied to terminals $V_D$ and $V_{WL}$ respectively, a voltage of 0 volts is applied to the terminal $V_S$, and the voltage of the terminal $V_{SG}$ is higher than the voltage of the terminal $V_B$. Due to the high voltage on the drain of the first transistor 160, the electrons from the source of the second transistor 170 accelerate and become heated due to the Channel Hot Electron (CHE) effect, and the electrons migrate through the insulating material to the gate 124 as well as the floating gate. The trapped electrons on the gate 124 have a negative charge and lower the potential of the gate 124. A programmed first transistor 160 could be established to represent a "1", and an un-programmed first transistor 160 could be established to represent a "0". Or alternatively, an un-programmed first transistor 160 could be established to represent a "1", and a programmed first transistor 160 could be established to represent a "0". In either case, a programmed or un-programmed state of the gate 124 can be sensed by determining if the gate 124 as well as the floating gate is positively or negatively charged.

In a first erase operation, a voltage of terminal $V_D$ is higher than a voltage of terminal $V_S$, a voltage of terminal $V_{WL}$ is higher than or approximately equal to 0, a voltage of terminal $V_{SG}$ is higher than a voltage of terminal $V_B$, and voltages of terminals $V_S$ and $V_S$ are approximately equal to 0. Specifically, the first transistor 160 is erased using Drain Hot Hole Injection (DAHHI) effect by applying a voltage of 6 to 10 volts to the terminal $V_D$ and applying a voltage of 0 to 1 volts to the terminal $V_{WL}$ so that the first transistor 160 is weakly turned on. The voltage of the terminal $V_{SG}$ is higher than the voltage of the terminal $V_B$. In other embodiments, the voltage applied to the terminal $V_{WL}$, depends on the amount of the electrons trapped on the floating gate. Applying these voltages causes DAHHI effect which erases the negative charge, if present, on the gate 124 as well as the floating gate. The DAHHI effect causes impact ionization on the drain of the first transistor 160, creates lots of holes injecting into the floating gate to couple with the trapped electrons. Therefore, the bit information on the floating gate is erased. Alternatively, in other embodiments, the data stored on the first transistor 160 may be erased using other methods, voltages, and voltage terminals.

In a second erase operation, a voltage of terminal $V_D$ is higher than a voltage of terminal $V_B$, a voltage of terminal $V_{WL}$, is lower than or approximately equal to 0, a voltage of terminal $V_{SG}$ is approximately equal to 0, a voltage of terminal $V_S$ is floated or approximately equal to 0, and a voltage of terminal $V_B$ is approximately equal to 0. Specifically, the first transistor 160 is erased using Band to Band Hot Hole (BBHH) effect by applying a voltage of 6 to 10 volts to the terminal $V_D$, and applying a voltage of −1 to 0 volts to the terminal $V_{WL}$, and applying a voltage of 0 volts to the terminal $V_{SG}$ so that the second transistor 170 is turned off. Due to the large voltage difference between the drain and the gate of the first transistor 160, the BBHH effect causes impact ionization on the drain of the first transistor 160, creates lots of holes injecting into the floating gate to couple with the trapped electrons. Therefore, the bit information on the floating gate is erased.

In a read operation, a voltage of terminal $V_D$ is higher than a voltage of terminal $V_B$, a voltage of terminal $V_{WL}$ is higher than a voltage of terminal $V_B$, and a voltage of terminal $V_{SG}$ is higher than a voltage of terminal $V_B$. Specifically, the data stored in the first transistor 160 is sensed by applying voltages on the terminals $V_{WL}$, $V_{SG}$ and $V_D$ which are higher than the voltages of the terminal $V_B$. The drain current indicating the amount of the charge stored in the gate 124 of the first transistor is detected by a sense amplifier (not shown). Alternatively, in other embodiments, the gate 124 as well as the floating gate of the memory cell 190 may be programmed and/or read using other methods, voltages, currents, and/or voltage terminals. It should be noted that a voltage of 0 volts is applied to the terminal $V_{SG}$ so that the second transistor 170 is turned off when the memory cell 190 is not selected to perform a write operation or a read operation. Therefore, the operation and the voltages applied to terminals of the memory cell 190 is shown on TABLE 1 as follows:

TABLE 1

| | $V_D$ | $V_{WL}$ | $V_{SG}$ | $V_S$ | $V_B$ |
|---|---|---|---|---|---|
| Program Operation | $>V_S$ | $>V_S$ | $>V_B$ | 0 V | 0 V |
| Erase Operation - 1 | $>V_S$ | 0 V~1 V | $>V_B$ | 0 V | 0 V |
| Erase Operation - 2 | $>V_B$ | −1 V~0 V | 0 V | 0 V or float | 0 V |
| Read Operation | $>V_B$ | $>V_B$ | $>V_B$ | — | — |
| None Of Above | — | — | 0 V | — | — |

Figure 3:
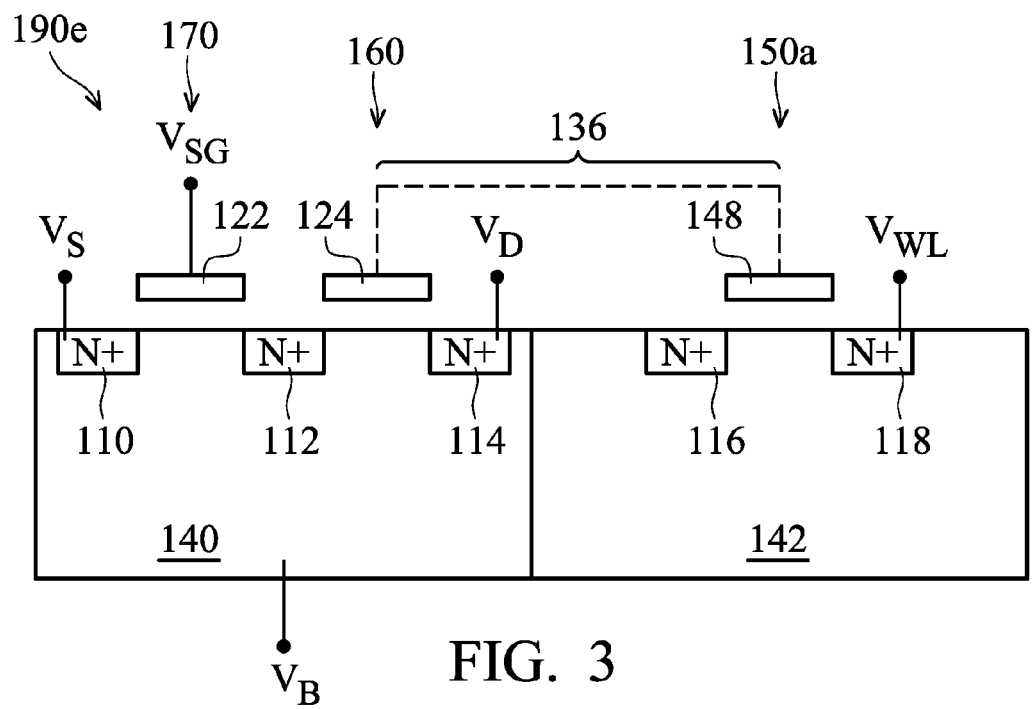
FIG. 3 illustrates a cross-sectional view of a memory cell in accordance with some embodiments.

FIG. 3 is a cross-sectional view of a memory cell 190 in accordance with some embodiments. The memory cell 190e includes a first transistor 160, a second transistor 170 and a capacitor 150a. The capacitor 150a is a capacitor-connected transistor. The first transistor 160 and the second transistor 170 are formed over a P-type well 140 or a P-type substrate. The capacitor 150a is formed over an N-type well 142. Both the P-type well 140 and the N-type well 142 could be formed over a semiconductor substrate (not shown). The gate 122 of the second transistor 170 is connected to the terminal $V_{SG}$. The source and drain of the second transistor 170 may comprise ion-doped regions ($n^+$ region, for example) 110 and 112 respectively formed in the P-type well 140, and the source and drain of the second transistor 170 are formed in the P-type well 140 proximate to the gate 124; e.g., proximate to opposite sides of the gate 122. A portion of the P-type well 140 comprises a channel region (not shown) of the second transistor 170, and the channel region is disposed between ion-doped regions 110 and 112.

The gate 124 of the first transistor 160 is electrically connected to the gate 148 of the capacitor-connected transistor (i.e., capacitor 150a) to form a floating gate 136. The source and drain of the first transistor 160 may comprise ion-doped regions 112 and 114 respectively formed in the P-type well 140, and are disposed in the P-type well 140 proximate to the gate 124; e.g., proximate to opposite sides of the gate 124. A portion of the P-type well 140 comprises a channel region (not shown) of the first transistor 160, and the channel region is disposed between ion-doped regions 112 and 114. The ion-doped region 112 is shared by the first and second transistors 160 and 170. Therefore, the first transistor 160 and the second transistor 170 are connected in series with each other. The gate 148 of the capacitor-connected transistor (i.e., capacitor 150a) functions as the first plate. The second plate of the capacitor 150a may comprise implantation regions implanted with dopant material, such as n-type dopants, as an example. In some embodiments, ion-doped regions 116 and 118 respectively formed in the N-type well 142, and ion-doped regions 118 functions as the second plate and is connected to the terminal $V_{WL}$.

Figure 4:
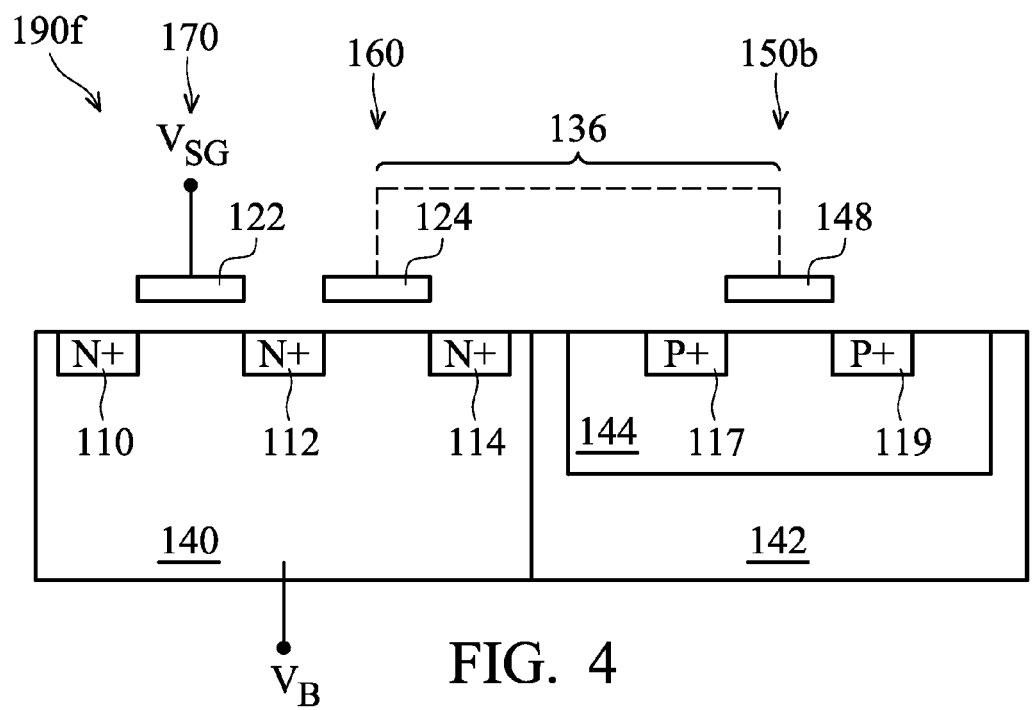
FIG. 4 illustrates a cross-sectional view of a memory cell in accordance with other embodiments.

Referring to FIG. 4, there is a cross-sectional view of a memory cell 190f in accordance with other embodiments. The first transistor 160 and the second transistor 170 are the same as in FIG. 3, however, the capacitor-connected transistor (i.e., capacitor 150b) is formed on a P-type well 144 which is over the N-type well 142. The P-type well 144 and the P-type well 140 could be formed in the same manufacturing process, so that the materials and features of the P-type well 144 and the P-type well 140 are the same.

Figure 5:
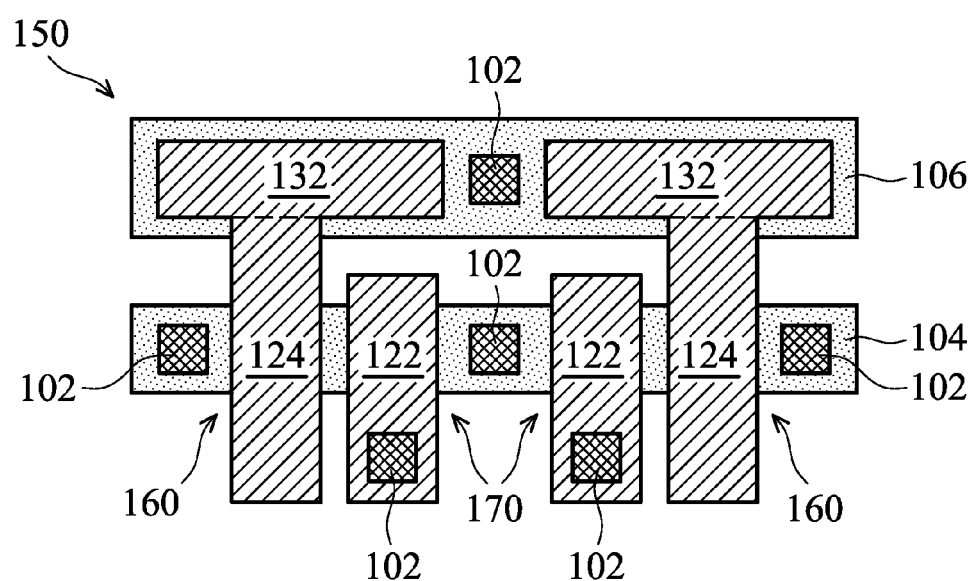
FIG. 5 illustrates a top view of the memory cell in accordance with some embodiments.

Referring to FIG. 5, the first transistor 160 and the second transistor 170 in the top view of the memory cell 190 are aligned alongside the first transistor 160 and the second transistor 170 respectively of the schematic of FIG. 2. Likewise, the capacitor 150 in the top view of the memory cell 190 is aligned alongside the capacitor 150 of the schematic. The top view of FIG. 5 illustrates the floating gate including the gate 124 of the transistor 160 and the first plate 132 of the capacitor 150, and also illustrates the gate 122 of the second transistor 170. The first plate 132 is formed over the active region 106, and the gate 124 and the gate 122 are formed over the active region 104. In addition, several contacts 102 are electrically coupled to conductive lines, conduct pads, and/or terminals of the memory cell 190, for example.

The advantages of some embodiments of the disclosure include providing a novel memory cell 190 having two transistors connected in series, and one of the transistors functions as a switch to prevent leakage current from the memory cell 190. When a selected memory cell 190 is under program operation and/or erase operation, many un-selected cells may be turn-on weakly. This kindly of leakage will induce higher write power consumption or cause write function failed. Since one of the transistors functions as a switch, that transistor could be turned off so that the leakage current can not pass through. Therefore, there is almost no leakage current from the memory cell 190, and a better program and/or performance could be obtained.

FIG. 5 illustrates a schematic of a memory device 200 including a number of memory cells 190 in accordance with some embodiments. In some embodiments, each memory cell 190 includes a second transistor 170 functioning as a switch. If a certain memory cell 190 is not selected, then the second transistor 170 in that certain memory cell 190 is turned off so that no leakage current could flow out of the certain memory cell 190. For example, if the bit line BL1 and the word line WL1 are applied with certain voltages, the memory cell 190d is selected to perform a write operation and/or a read operation. However, the second transistors 170 of the other unselected memory cells 190a, 190b, and 190c are turned off and there are no leakage currents generated from such unselected memory cells 190a, 190b, and 190c, therefore, there are no leakage currents affecting the electrons of the electronic elements of the selected memory device 190d, so that the memory device 190d could function properly. Therefore, the novel memory cell 190 of the present disclosure prevents the leakage current in the memory cells, so that the selected memory cell could function properly on erase, write and/or read operations.

In accordance with some embodiments of the present disclosure, a memory device includes a number of memory cells. Each of the memory cells includes a first transistor, a switch and a capacitor. The first transistor has a drain connected to a corresponding bit-line. The switch has a first terminal connected to a source of the first transistor and a second terminal coupled to a reference voltage. The capacitor has a first plate and a second plate, and the first plate of the capacitor is electrically connected to a gate of the first transistor. The second plate of the capacitor is connected to a corresponding word line. The switch is turned off when the memory cell is not selected to perform a write operation or a read operation. In accordance with other embodiments, a memory cell includes a first P-type well, a first transistor, a capacitor and a second transistor. The first transistor is disposed on the P-type well and has a gate between a first ion-doped region and a second ion-doped region. The first ion-doped region functions as a drain of the first transistor and connects to a corresponding bit-line. The capacitor has a plate and at least one ion-doped region. The plate of the capacitor is electrically connected to the gate, and one of the ion-doped regions is connected to a corresponding word-line. The second transistor is disposed on the P-type well and has a gate between the second ion-doped region and a third ion-doped region. The third ion-doped region functions as a source of the second transistor. The second transistor is turned off when the memory cell is not selected to perform a write operation or a read operation.

In accordance with other embodiments, an operation method of a memory cell is provided. The memory cell includes a first transistor, a capacitor and a second transistor. The second transistor has a drain connected to a source of the first transistor. The capacitor has a first plate and a second plate. The first plate of the capacitor is electrically connected to a gate of the first transistor. Terminals $V_D$, $V_{WL}$, $V_{SG}$, $V_S$, $V_B$ are respectively connected to a drain of the first transistor, the second plate of the capacitor, a gate of the second transistor, a source of the second transistor, and a bulk of the first transistor. The operating method is characterized in turning off the second transistor when the memory cell is not selected to perform a write operation nor a read operation.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A memory device, comprising:
   a plurality of memory cells, each comprising:
      a first transistor, having a drain connected to a corresponding bit-line;
      a switch, having a first terminal connected to a source of the first transistor and a second terminal coupled to a reference voltage; and
      a capacitor, having a first plate and a second plate, wherein the first plate of the capacitor is electrically connected to a gate of the first transistor, the second plate of the capacitor is connected to a corresponding word line, and the switch is turned off when the memory cell is not selected to perform a write operation or a read operation, the switch comprises a second transistor having a drain connected to the source of the first transistor and a source coupled to the reference voltage, and the second transistor is turned on when the memory cell is selected to perform a first erase state.

2. The memory device as claimed in claim 1, wherein the first transistor and the second transistor are NMOS transistors.

3. The memory device as claimed in claim 1, wherein the first transistor and the second transistor are turned on when the memory cell is selected to perform the read operation.

4. The memory device as claimed in claim 1, wherein the first transistor and the second transistor are turned on when the memory cell is selected to perform a program operation which belongs to the write state.

5. The memory device as claimed in claim 1, wherein the first transistor is weakly turned on when the memory cell is selected to perform a first erase state or a second erase state which belong to the write state.

6. The memory device as claimed in claim 5, wherein the second transistor is turned off when the memory cell is selected to perform a second erase state.

7. The memory device as claimed in claim 1, wherein the capacitor comprises a metal-oxide-metal (MOM) capacitor, a metal-insulation-metal (MIM) capacitor or a combination thereof.

8. The memory device as claimed in claim 1, wherein the capacitor comprises a third transistor having a gate functioning as the first plate and having a drain/source functioning as the second plate.

9. The memory device as claimed in claim 8, wherein the third transistor is an N-type transistor or a P-type transistor.

10. A memory cell, comprising
    a first P-type well;
    a first transistor, disposed on the P-type well, and having a gate between a first ion-doped region and a second ion-doped region, wherein the first ion-doped region functions as a drain of the first transistor and connects to a corresponding bit-line;
    a capacitor, having a plate and at least one ion-doped regions, wherein the plate of the capacitor is electrically connected to the gate, and one of the ion-doped regions is connected to a corresponding word line; and
    a second transistor, disposed on the P-type well, and having a gate between the second ion-doped region and a third ion-doped region, wherein the third ion-doped region functions as a source of the second transistor, and the second transistor is turned off when the memory cell is not selected to perform a write operation or a read operation, and the second transistor is turned on when the memory cell is selected to perform a first erase state.

11. The memory cell as claimed in claim 10, wherein the capacitor is disposed on an N-type well adjacent to the first P-type well.

12. The memory cell as claimed in claim 11, wherein the capacitor is disposed on a second P-type well within the N-type well.

13. The memory cell as claimed in claim 12, wherein the second P-type well is identical to the to the first P-type well.

14. An operation method of a memory cell, wherein the memory cell comprising:
    a first transistor;
    a second transistor, having a drain connected to a source of the first transistor; and
    a capacitor, having a first plate and a second plate, wherein the first plate of the capacitor is electrically connected to a gate of the first transistor and terminals VD, VWL, VSG, VS, VB are respectively connected to a drain of the first transistor, the second plate of the capacitor, a gate of the second transistor, a source of the second transistor, and a bulk of the first transistor; wherein the operating method is characterized in:
    turning off the second transistor when the memory cell is not selected to perform a write operation nor a read operation, and turning on the second transistor when the memory cell is selected to perform a first erase state.

15. The operation method of a memory cell as claimed in claim 14, wherein when the memory cell is selected to perform a program operation which belongs to the write state, a voltage of the terminal VD is higher than a voltage of terminal VS, a voltage of terminal VWL is higher than a voltage of terminal VS and a voltage of terminal VSG is higher than a voltage of terminal VB so that the first transistor and the second transistor are turned on.

16. The operation method of a memory cell as claimed in claim 14, wherein when the memory cell is selected to perform the first erase state which belongs to the write state, a voltage of terminal VD is higher than a voltage of terminal VS, a voltage of terminal VWL is higher than or approximately equal to 0, and a voltage of terminal VSG is higher than a voltage of terminal VB.

17. The operation method of a memory cell as claimed in claim 14, wherein when the memory cell is selected to perform a second erase state which belongs to the write state, a voltage of terminal VD is higher than a voltage of terminal VB, a voltage of terminal VWL is lower than or approximately equal to 0, and a voltage of terminal VSG is approximately equal to 0 so that the first transistor is weakly turned on and the second transistor is turned off.

18. The operation method of a memory cell as claimed in claim 14, wherein when the memory cell is selected to perform a read state, a voltage of terminal VD is higher than a voltage of terminal VB, a voltage of terminal VWL is higher than a voltage of terminal VB, and a voltage of terminal VSG is higher than a voltage of terminal VB so that the first transistor and the second transistor are turned on.

* * * * *